United States Patent
Hebbeker et al.

[11] Patent Number: 5,929,491
[45] Date of Patent: Jul. 27, 1999

[54] INTEGRATED CIRCUIT WITH ESD PROTECTION

[75] Inventors: Heinz Hebbeker, Bayersoien; Werner Reczek, Ottobrunn; Dominique Savignac, Ismaning; Hartmud Terletzki, München, all of Germany

[73] Assignee: Siemens Aktiengesellschaft, Munich, Germany

[21] Appl. No.: 09/009,602

[22] Filed: Jan. 20, 1998

Related U.S. Application Data

[63] Continuation of application No. PCT/DE96/01258, Jul. 11, 1996.

[30] Foreign Application Priority Data

Jul. 20, 1995 [DE] Germany .................. 195 26 566

[51] Int. Cl.$^6$ ............... H01L 23/62; H01L 29/00
[52] U.S. Cl. ............. 257/355; 257/356; 257/360; 257/173; 257/546
[58] Field of Search ............... 257/355, 356, 257/360, 362, 363, 546, 173

[56] References Cited

U.S. PATENT DOCUMENTS

| | | | |
|---|---|---|---|
| 5,293,057 | 3/1994 | Ho et al. ................ | 257/356 |
| 5,426,323 | 6/1995 | Reczek et al. .......... | 257/360 |
| 5,449,939 | 9/1995 | Horiguchi et al. ...... | 257/362 |
| 5,698,886 | 12/1997 | Thenoz et al. ......... | 257/355 |
| 5,705,841 | 1/1998 | Yu .......................... | 257/355 |

FOREIGN PATENT DOCUMENTS

| | | |
|---|---|---|
| 0217525A1 | 4/1987 | European Pat. Off. . |
| 0253105A1 | 1/1988 | European Pat. Off. . |
| 0444686A1 | 9/1991 | European Pat. Off. . |

*Primary Examiner*—Mahshid Saadat
*Assistant Examiner*—Jesse A. Fenty
*Attorney, Agent, or Firm*—Herbert L. Lerner; Laurence A. Greenberg

[57] ABSTRACT

A parasitic field effect transistor or a parasitic diode is formed in an integrated circuit. The parasitic element is formed by two doped regions of the same or opposite conductivity type and an insulating region therebetween. The doped regions are each connected to a respective terminal pad of the integrated circuit. To increase the ESD strength, the length of the insulating region in the lateral direction is greater than or equal to a length of the longest discharge path of the ESD protection structures connected to the terminal pads.

19 Claims, 1 Drawing Sheet

INTEGRATED CIRCUIT WITH ESD PROTECTION

CROSS-REFERENCE TO RELATED APPLICATION

This is a continuation of copending international application PCT/DE96/01258, filed Jul. 11, 1996, which designated the United States.

BACKGROUND OF THE INVENTION

FIELD OF THE INVENTION

The invention relates to integrated circuits.

Integrated circuits must be protected against electrostatic discharges (ESDs). To that end, their terminal pins are generally provided with corresponding protection structures. The ESD protection structures are usually field oxide transistors, which are disposed between the terminal pads and the supply potentials of the circuit. It is the task of the ESD protection structures, in the event of an ESD, to dissipate the resultant charges harmlessly along their discharge paths. Where a field oxide transistor forms the ESD protection structure, for instance, the discharge path is through its channel.

SUMMARY OF THE INVENTION

It is accordingly an object of the invention to provide an integrated circuit, which overcomes the above-mentioned disadvantages of the prior art devices and methods of this general type and which is improved with regard to the ESD protection afforded the integrated circuit.

With the foregoing and other objects in view there is provided, in accordance with the invention, an integrated circuit with a plurality of terminal pads, comprising:

a substrate of a first conductivity type;

a parasitic transistor formed by two mutually spaced-apart doped regions disposed in the substrate and an insulating region having a given length disposed laterally between the doped regions, the doped regions being of a second conductivity type (n, n+, n−) and each being connected to a respective terminal pad of the integrated circuit;

an ESD protection structure in the form of a field oxide transistor connecting a respective terminal pad of the integrated circuit to at least one of a supply potential and another terminal pad of the integrated circuit;

the ESD protection structure having a discharge path of a given length formed by a channel of the field oxide transistor for dissipating discharge current in the event of an electrostatic discharge;

the given length of the insulating region being equal to or greater than the given length of the discharge path of the ESD protection structure.

In accordance with an added feature of the invention, the given length of the insulating region is at least 1.5 times the given length of the discharge path of the ESD protection structure.

Where a plurality of ESD protection structures are provided, the length of the insulating region is equal to or greater than a longest discharge path of the ESD protection structures.

In accordance with an additional feature of the invention, the given length of the insulating region is at least 1.5 times the given length of the longest discharge path of the ESD protection structures.

In accordance with another feature of the invention, the integrated circuit has terminal pins and one of the terminal pads is connected to one of the terminal pins of the integrated circuit.

In accordance with a further feature of the invention, the terminal pads are adapted to be connected to an exterior electrode, such as a test prod.

In accordance with a concomitant feature of the invention, the insulating region is a LOCOS region and/or a trench insulation.

The invention is based on the premise that two adjacent doped regions of the same conductivity type, between which an insulating region is located and which are each connected to one terminal pad of the integrated circuit and form a parasitic field effect transistor (i.e., a field effect transistor not planned in the circuitry) are especially at risk from ESD events. If the doped regions are of different conductivity types, then they can form a corresponding parasitic diode, which is likewise threatened by ESD events.

Other features which are considered as characteristic for the invention are set forth in the appended claims.

Although the invention is illustrated and described herein as embodied in an integrated circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
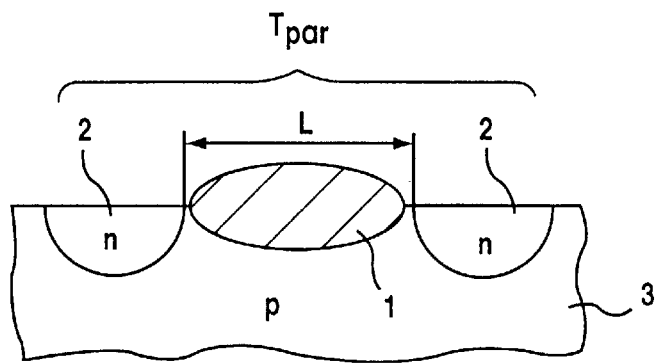
FIG. 1 is a partial sectional view of a first embodiment of the invention.

Referring now to the figures of the drawing in detail and first, particularly, to FIG. 1 thereof, there are seen two laterally adjacent doped regions 2 disposed on the surface of a substrate 3. An insulating region 1 is disposed between the doped regions 2. The insulating region 1 in FIG. 1 is a so-called LOCOS region (LOCOS is an acronym for "local oxidation of silicon"). The doped regions 2 and the insulating region 1 form a parasitic semiconductor element $T_{par}$, in this case a parasitic transistor.

The doped regions 2 are of the same conductivity type. In the present exemplary embodiment they are n-doped. In other exemplary embodiments, however, they may also both be p-doped. Both the dopant concentration and the type of dopant can, however, be different for the two doped regions 2. The doped regions 2 may also be located in an epitaxial layer, for example, rather than in the substrate 3. The doped regions 2 may either be diffusion regions (as shown), or wells, or so-called LDD regions (LDD is an acronym for "lightly doped drain"), or a combination of these alternatives. LDD regions are drain regions that have a lesser dopant concentration at their edge than in their interior.

The substrate 3 is of the opposite conductivity type from the doped regions 2. In the exemplary embodiment, therefore, the substrate is p-doped.

It is possible for the two doped regions 2 to be of different conductivity types, in which case the parasitic semiconductor element $T_{par}$ is a parasitic diode. The invention is applicable to such structures as well.

Figure 2:
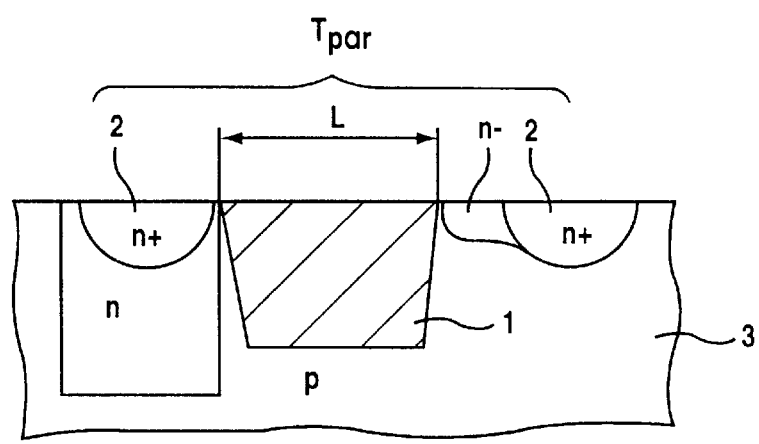
FIG. 2 is a similar view of a second exemplary embodiment of the invention.

In the exemplary embodiment of FIG. 2, the insulating region 1 is a trench in the substrate 3 (trench insulation). In other exemplary embodiments, the insulating region 1 may be realized as a combination of the LOCOS region shown in FIG. 1 and the trench insulation.

The doped region 2 on the left in FIG. 2 is realized as an $n^+$ diffusion in an n well, while the doped region 2 on the right is in the form of an LOCOS region.

Such parasitic transistors $T_{par}$ exist for instance wherever the doped regions 2 are drain regions or source regions of two mutually adjacent, otherwise separate, transistors which are intended as non-parasitic in the circuit. However, one of the doped regions 2 may also be a guard ring, for example.

Figure 3:
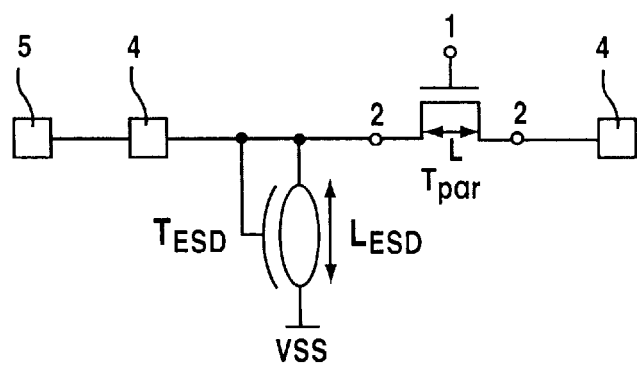
FIG. 3 is a diagrammatic view of an exemplary embodiment of the invention.

FIG. 3 is a schematic circuit diagram for an exemplary embodiment of the invention. The parasitic transistor may be embodied in accordance with FIG. 1 or FIG. 2. The doped regions 2 are each connected to one terminal pad 4 of the integrated circuit. One of the terminal pads 4 is connected in turn to a terminal pin 5 of the integrated circuit. Such a connection is typically made by way of so-called bond wires. The terminal pins 5 are external terminals of the integrated circuit. The other terminal pad 4 is not connected to any terminal pin 5. It may for example be a measurement point that can be contacted by means of a test prod (wand tip). Such terminal pads 4 are as much at risk of ESD, while measurements are being made, as are the terminal pads 4 that are connected to terminal pins 5.

In other embodiments of the invention, both terminal pads 4 may each be connected to one terminal pin 5, or neither terminal pad may be connected to a terminal pin.

FIG. 3 also shows, not drawn to scale, an ESD protection structure $T_{ESD}$ in the form of a field oxide transistor, which by its channel path (i.e., its discharge path) is connected between one of the terminal pads 4 or the corresponding doped region 2 and a supply potential VSS of the integrated circuit. VSS, in this case, is ground. Its gate is likewise connected to the terminal pad 4. In other embodiments of the invention, such an ESD protection structure $T_{ESD}$ may also be provided for both doped regions 2.

In general in integrated circuits, all the terminal pins 5 of an integrated circuit are provided with at least one ESD protection structure $T_{ESD}$, which can be connected to various supply potentials, such as ground and VDD potential. It is also known to provide an ESD protection structure $T_{ESD}$ between two terminal pads 4 that are connected to terminal pins 5. The latter is especially true if the two terminal pins 5 are supply potential terminals.

According to the invention, a length L of the insulating region 1 in the lateral direction (width L) is greater than or equal to the length $L_{ESD}$ of a longest discharge path of the ESD protection structures TESD connected to the terminal pads 4.

This increases the ESD strength of the parasitic transistor $T_{par}$, since its ohmic resistance increases with the length L of the insulating region 1. The greater the length L, the higher the ohmic resistance of the parasitic transistor $T_{par}$. According to the invention, the dimensioning of the parasitic transistor $T_{par}$ is dependent on the dimensions of the ESD protection structures $T_{ESD}$. Since the latter are already laid out for high ESD strength, a high ESD strength is also attained for the parasitic transistor in the above-described manner. Tests have shown that an especially high ESD strength of the parasitic transistor $T_{par}$ is attained if the length L of the insulating region 1 is at least 1.5 times the length of the longest discharge path of the ESD protection structures $T_{ESD}$.

The channel width of an ESD protection structure $T_{ESD}$ in the form of a field oxide transistor is generally known to be very much greater than that of other structures, such as those of the parasitic transistors $T_{par}$. Accordingly, the same flow of current through the ESD protection structure $T_{ESD}$ and the parasitic transistor $T_{par}$ leads to a very much lesser current density in the ESD protection structure. By the aforementioned dimensioning according to the invention of the parasitic transistor $T_{par}$, however, the transistor comes to have higher ohmic resistance than the ESD protection structures $T_{ESD}$, so that for an ESD-caused overvoltage of the same magnitude, the discharge current via the parasitic transistor $T_{par}$ is less than via the ESD protection structure $T_{ESD}$. This results in a lesser current density, and the ESD strength of the parasitic transistor $T_{par}$ is increased.

We claim:

1. An integrated circuit with a plurality of terminal pads, comprising:

a substrate of a first conductivity type;

an ESD protection structure in the form of a field oxide transistor connecting a respective terminal pad of the integrated circuit to a supply potential;

said ESD protection structure having a discharge path of a given length formed by a channel of the field oxide transistor for dissipating discharge current in the event of an electrostatic discharge;

a parasitic transistor protected by said ESD protection structure and formed by two mutually spaced-apart doped regions disposed in said substrate and an insulating region having a given length disposed laterally between said doped regions, said doped regions being of a second conductivity type and each being connected to a respective terminal pad of the integrated circuit;

said given length of said insulating region being equal to or greater than the given length of the discharge path of said ESD protection structure.

2. The integrated circuit of claim 1, wherein the given length of said insulating region is at least 1.5 times the given length of the discharge path of said ESD protection structure.

3. The integrated circuit according to claim 1, wherein said ESD protection structure is one of a plurality of ESD protection structures each having a discharge path of a given length, and wherein said given length of said insulating region is equal to or greater than a longest discharge path of said ESD protection structures.

4. The integrated circuit of claim 1, wherein the given length of said insulating region is at least 1.5 times the given length of the longest discharge path of said ESD protection structure.

5. The integrated circuit according to claim 1, wherein the integrated circuit has terminal pins and one of the terminal pads is connected to one of the terminal pins of the integrated circuit.

6. The integrated circuit according to claim 1, wherein the terminal pads are adapted for connection to an exterior electrode.

7. The integrated circuit according to claim 1, wherein the terminal pads are adapted for connection to an exterior test prod.

8. The integrated circuit according to claim 1, wherein said insulating region is a LOCOS region.

9. The integrated circuit according to claim 1, wherein said insulating region is a trench insulation.

10. An integrated circuit with a plurality of terminal pads, comprising:

a substrate of a first conductivity type;

an ESD protection structure in the form of a field oxide transistor connecting a respective terminal pad of the integrated circuit to another terminal pad of the integrated circuit;

said ESD protection structure having a discharge path of a given length formed by a channel of the field oxide transistor for dissipating discharge current in the event of an electrostatic discharge;

a parasitic transistor protected by said ESD protection structure and formed by two mutually spaced-apart doped regions disposed in said substrate and an insulating region having a given length disposed laterally between said doped regions, said doped regions being of a second conductivity type and each being connected to a respective terminal pad of the integrated circuit;

said given length of said insulating region being equal to or greater than the given length of the discharge path of said ESD protection structure.

11. The integrated circuit of claim 10, wherein the given length of said insulating region is at least 1.5 times the given length of the discharge path of said ESD protection structure.

12. The integrated circuit according to claim 10, wherein said ESD protection structure is one of a plurality of ESD protection structures each having a discharge path of a given length, and wherein said given length of said insulating region is equal to or greater than a longest discharge path of said ESD protection structures.

13. The integrated circuit of claim 10, wherein the given length of said insulating region is at least 1.5 times the given length of the longest discharge path of said ESD protection structure.

14. The integrated circuit according to claim 10, wherein the integrated circuit has terminal pins and one of the terminal pads is connected to one of the terminal pins of the integrated circuit.

15. The integrated circuit according to claim 10, wherein the terminal pads are adapted for connection to an exterior electrode.

16. The integrated circuit according to claim 10, wherein the terminal pads are adapted for connection to an exterior test prod.

17. The integrated circuit according to claim 10, wherein said insulating region is a LOCOS region.

18. The integrated circuit according to claim 10, wherein said insulating region is a trench insulation.

19. The integrated circuit according to claim 10, wherein said ESD protection structure connects said respective terminal pad of the integrated circuit to said supply potential and another terminal pad of the integrated circuit.

* * * * *